(12) United States Patent
Matsuyama et al.

(10) Patent No.: US 9,986,644 B2
(45) Date of Patent: May 29, 2018

(54) PROCESS FOR THE PRODUCTION OF ENTRY SHEET FOR DRILLING AND ENTRY SHEET

(75) Inventors: Yousuke Matsuyama, Tokyo (JP); Reiki Akita, Tokyo (JP); Takuya Hasaki, Tokyo (JP)

(73) Assignee: MITSUBISHI GAS CHEMICAL COMPANY, INC., Tokyo (JP)

( * ) Notice: Subject to any disclaimer, the term of this patent is extended or adjusted under 35 U.S.C. 154(b) by 49 days.

(21) Appl. No.: 12/457,885

(22) Filed: Jun. 24, 2009

(65) Prior Publication Data

US 2010/0167041 A1 Jul. 1, 2010

(30) Foreign Application Priority Data

Dec. 25, 2008 (JP) ................................ 2008-330447

(51) Int. Cl.
*H05K 3/00* (2006.01)

(52) U.S. Cl.
CPC ... *H05K 3/0047* (2013.01); *H05K 2203/0214* (2013.01); *H05K 2203/0786* (2013.01); *H05K 2203/127* (2013.01); *Y10T 428/249953* (2015.04)

(58) Field of Classification Search
CPC ......... H05K 3/0047; H05K 2203/0786; H05K 2203/214; H05K 2203/127; Y10T 428/249953
See application file for complete search history.

(56) References Cited

U.S. PATENT DOCUMENTS

| | | | |
|---|---|---|---|
| 4,340,167 A | 7/1982 | Packer et al. | |
| 5,082,402 A | 1/1992 | Gaku et al. | |
| 5,480,269 A | 1/1996 | Ejiri et al. | |
| 6,866,450 B2 | 3/2005 | Hasaki et al. | |
| 2002/0051684 A1 | 5/2002 | Eziri et al. | |
| 2007/0281181 A1* | 12/2007 | Akita et al. | 428/626 |
| 2009/0004373 A1* | 1/2009 | Rath et al. | 427/154 |

FOREIGN PATENT DOCUMENTS

| | | |
|---|---|---|
| CN | 1905780 | 1/2007 |
| JP | 2001-150215 | 6/2001 |
| JP | 2006-175570 | 7/2006 |
| KR | 10-2007-0115732 | 12/2007 |
| KR | 10-0832798 | 5/2008 |

OTHER PUBLICATIONS

"Mechanism of Bubble Formation During the Drying of Polymer Films" Reza Pourdarvish Mohammadi; the Pennsylvania State University (May 2005).*
Singapore Written Opinion and Search Report dated Jan. 21, 2011 in corresponding Singapore Application No. 200904247-4.
Chinese Office Action (with English translation) dated Jul. 11, 2011 in corresponding Chinese Application No. 200810187336.8.
Japanese Office Action dated Apr. 17, 2012 in corresponding Japanese Application No. 2008-330447, with English translation thereof.
Chinese Office Action dated Mar. 23, 2012 in corresponding Chinese Application No. 200810187336.8, with English translation thereof.
Singapore Office Action (in the English language) dated Nov. 10, 2011 in corresponding Singapore Application No. 200904247-4.
Korean Notice of Decision of Rejection (with English translation) dated Oct. 19, 2012 in corresponding Korean Patent Application No. 10-2008-0134125.
Korean Office Action dated Mar. 30, 2012 in corresponding Korean Application No. 10-2008-0134125.
Office Action dated Dec. 31, 2014 in corresponding Vietnamese patent application No. 1-2009-01341 (with English translation).
Indian Office Action dated Oct. 31, 2017 in corresponding Indian Patent Application No. 1303/DEL/2009.

* cited by examiner

*Primary Examiner* — Kevin R Kruer
(74) *Attorney, Agent, or Firm* — Wenderoth, Lind & Ponack, L.L.P.

(57) ABSTRACT

A process for the production of an entry sheet for drilling a printed wiring board material, which process comprises forming a multi-layered water-soluble resin composition layer on at least one surface of a metal foil, wherein an aqueous solution of a water-soluble resin composition is applied to the metal foil, dried and solidified to form one water-soluble resin composition layer, the application, drying and solidification of the aqueous solution of the water-soluble resin composition are repeated at least once to form at least one water-soluble resin composition layer on the above one water-soluble resin composition layer, the multi-layered water-soluble resin composition layer is composed of these water-soluble resin composition layers, the multi-layered water-soluble resin composition layer has a thickness of at least 50 μm and is almost free from air bubbles, and an entry sheet for drilling a printed wiring board material obtained by the above process.

2 Claims, No Drawings

PROCESS FOR THE PRODUCTION OF ENTRY SHEET FOR DRILLING AND ENTRY SHEET

FIELD OF THE INVENTION

The present invention relates to an entry sheet for drilling which is used for drilling a copper-clad laminate or a multi-layer board in steps of producing a printed wiring board.

BACKGROUND OF THE INVENTION

As a method for drilling a copper-clad laminate or a multi-layer board used for a printed wiring board material, a method in which a simple aluminum foil or an entry sheet for drilling obtained by forming a resin composition layer on a surface of an aluminum foil is disposed as an auxiliary sheet on the top surface of a copper-clad laminate, a multi-layer board or a stack of two or more copper-clad laminates or two or more multi-layer boards before drilling, is generally adopted. In recent years, high-quality drilling is required with regard to a printed wiring board material in accordance with a demand of improvement in reliability and a progress of high-densification. For example, an improvement in hole registration accuracy or a decrease in hole wall roughness is required. For coping with the requirement of high-quality drilling, a hole-making method which utilizes a sheet of a water-soluble resin composition such as polyethylene glycol (for example, JP-A-4-92494), a lubricant sheet for making a hole obtained by forming a water-soluble resin composition layer on a metal foil (for example, JP-A-6-344297) and an entry sheet for making a hole obtained by forming a thermosetting resin composition thin film on an aluminum foil and further forming a water-soluble resin composition layer (for example, JP-A-2003-136485) have been proposed and practically adopted. Here, the thickness of a water-soluble resin composition layer formed on a metal foil is very important for improving the quality of hole wall.

In a conventional laminating process, it is possible to laminate a water-soluble resin composition layer having a thickness of at least 50 μm to a metal foil surface. However, a solution method has the following problems. When a low viscosity solution of a water-soluble resin composition is thickly applied to a metal foil surface by a coating process, the solution drips during the application and drying and foaming occurs during the drying and the solidification of the water-soluble resin composition. Therefore, production is difficult by the solution method. When a thick water-soluble resin composition layer is formed by applying a water-soluble resin composition solution thickly and drying and solidifying the applied water-soluble resin composition through a method in which a clearance between an applied coating portion and a metal foil is broadened at an application time or through a method in which two water-soluble resin composition layers are successively formed from two applied coating portions respectively, air bubbles exist in the water-soluble resin composition layer and in addition the smoothness of the surface of the water-soluble resin composition layer decreases. The presence of air bubbles in the water-soluble resin composition layer and the decrease in the smoothness of the water-soluble resin composition layer surface adversely affect hole registration accuracy at a drilling time.

SUMMARY OF THE INVENTION

It is an object of the present invention to provide an entry sheet for drilling a printed wiring board material which entry sheet is excellent in hole registration accuracy and is obtained by preventing foaming, which occurs in a water-soluble resin composition layer at the time of drying and solidification of a water-soluble resin composition after application thereof and is a problem of conventional technologies about the formation of a water-soluble resin composition layer having a thickness of at least 50 μm on a metal foil, and a process for producing the above entry sheet.

It is another object of the present invention to provide an entry sheet for drilling a printed wiring board material, on the basis of the finding that adverse influence of foaming is prevented when the number of air bubbles having a diameter of at least 30 μm each, which generate at the time of drying and solidifying a water-soluble resin composition after application thereof, per an area of 100 mm×100 mm in a water-soluble resin composition layer is 20 or less, which entry sheet satisfies the above requirement and is excellent in hole registration accuracy, and a process for the production of the above entry sheet.

The present inventors have made diligent studies on a production process for coating a water-soluble resin composition layer thickly with controlling the number of air bubbles in the water-soluble resin composition layer to a small extent. As a result, the present inventors have found that the above-mentioned problems of conventional technologies can be solved by decreasing the thickness of a water-soluble resin composition layer, which is formed by carrying out application, drying and solidification of a water-soluble resin composition once, and forming a plurality of such water-soluble resin composition layers having a small thickness each. On the basis of the above finding, the present inventors have arrived at the present invention. The present inventors have found that a decrease in the thickness of one water-soluble resin composition layer, which is formed by carrying out the application, drying and solidification once, reduces internal air bubbles generating at the time of forming the water-soluble resin composition layer. Further, the present inventors have found that the sequential formation of water-soluble resin composition layers having a small thickness each reduces re-melting of an already-formed water-soluble resin composition layer at the time of forming a second or subsequent water-soluble resin composition layer and, accordingly, the above sequential formation can prevent the generation of internal air bubbles.

That is, the present invention provides a process for the production of an entry sheet for drilling a printed wiring board material, comprising forming a multi-layered water-soluble resin composition layer on at least one surface of a metal foil, wherein one water-soluble resin composition layer having a thickness of 10 μm to 50 μm is formed by applying an aqueous solution of a water-soluble resin composition to the metal foil and drying and solidifying the applied solution, at least one water-soluble resin composition layer is formed on the above one water-soluble resin composition layer by repeating the application, drying and solidifying of the aqueous solution of the water-soluble resin composition at least once, the multi-layered water-soluble resin composition layer is composed of the one water-soluble resin composition layer and the at least one water-soluble resin composition layer, and the thickness of the multi-layered water-soluble resin composition layer is at least 50 μm.

The present invention further provides an entry sheet for drilling a printed wiring board material which entry sheet comprises a metal foil and a multi-layered water-soluble resin composition layer formed on at least one surface of the metal foil, wherein the thickness of the multi-layered water-soluble resin composition layer is at least 50 μm and the number of air bubbles having a diameter of at least 30 μm each in the multi-layered water-soluble resin composition layer is 20 or less per an area of 100 mm×100 mm, and a process for the production of the above entry sheet.

EFFECT OF THE INVENTION

According to the process for the production of an entry sheet for drilling, in which the thickness of a multi-layered water-soluble resin composition layer formed by carrying out the application, drying and solidification of a water-soluble resin composition at least two times is at least 50 μm, provided by the present invention, it is possible to obtain an entry sheet for drilling which can decrease the roughness of inner hole walls at a drilling time since the multi-layered water-soluble resin composition layer is thick, has an extremely small number of air bubbles in the multi-layered water-soluble resin composition layer which air bubbles adversely affect hole registration accuracy, has a smooth multi-layered water-soluble resin composition layer surface, and is excellent in thickness accuracy. Further, as compared with a conventional laminating method for forming a water-soluble resin composition layer having a thickness of at least 50 μm, an auxiliary material such as a PET film, which is a support substrate necessary at the time of producing a resin sheet, is not required according to the present invention so that an industrially advantageous production process is provided.

DETAILED DESCRIPTION OF THE INVENTION

The present invention is directed to a process for the production of an entry sheet for drilling which process is characterized in that a multi-layered water-soluble resin composition layer to be formed on a metal foil is formed by separately forming several water-soluble resin composition layers one by one, and an entry sheet having a multi-layered water-soluble resin composition layer containing an extremely small number of air bubbles, obtained by the above process.

In the process for the production of an entry sheet for drilling, provided by the present invention, a water-soluble resin is dissolved in a solvent medium such as water, an alcohol or a solvent and the mixture is stirred to prepare a water-soluble resin composition solution. The solid content concentration based on the solvent medium is preferably 10% to 70%. In an example of a method of forming the multi-layered water-soluble resin composition layer by several applications of the above water-soluble resin composition solution, for example, the water-soluble resin composition solution for a first water-soluble resin composition layer is applied to a metal foil by coating means such as a bar coater, a die or an extruder, then the water-soluble resin composition solution applied to the metal foil is dried and solidified with a dryer and a cooling device to form a first water-soluble resin composition layer, the water-soluble resin composition solution is again applied to the above solidified first water-soluble resin composition layer by the above coating means, and the applied water-soluble resin composition solution is dried and solidified with a dryer and a cooling device to form a multi-layered water-soluble resin composition layer. According to the above method, it becomes possible to increase the thickness of the multi-layered water-soluble resin composition layer formed by carrying out the application, drying and solidification at least two times. The number of applications of the water-soluble resin composition solution for forming the multi-layered water-soluble resin composition layer is at least two, and it is preferably two or three. In production, each of the number of dryers and the number of cooling devices is not necessarily one in one line. A sequential method can be adopted in which several dryers and cooling devices are successively disposed in series and the application, drying and solidification are successively carried out. In the present invention, the term "solidification" means that the temperature of the water-soluble resin composition, which has increased to more than the melting point of the water-soluble resin composition by drying, is decreased to less than the melting point, preferably to room temperature, by cooling the dried water-soluble resin composition or allowing the dried water-soluble resin composition to stand.

The thickness of the multi-layered water-soluble resin composition layer composed of several water-soluble resin composition layers in the entry sheet for drilling, provided by the present invention, is preferably at least 50 μm, more preferably in the range of 50 to 250 μm, furthermore preferably in the range of 50 to 100 μm. When the thickness of the multi-layered water-soluble resin composition layer is less than 50 μm, it is preferred to form a water-soluble resin composition layer by a single application in view of production steps. When the thickness of the multi-layered water-soluble resin composition layer is larger than 250 μm, a merit in production cost due to carrying out the application several times is decreased so that other methods are advantageous. The thickness of the water-soluble resin composition layer, which is formed by carrying out the application, drying and solidification once, in the entry sheet of the present invention is preferably in the range of 10 to 50 μm. For attaining high thickness accuracy, the sequential production process mentioned in the present invention is effective. It is preferred that the water-soluble resin composition layer as a primer coating layer is completely solidified.

The water-soluble resin composition used in the multi-layered water-soluble resin composition layer of the entry sheet for drilling, provided by the present invention, is not specially limited so long as it is a polymer compound which can be dissolved in an amount of 1 g or more in 100 g of water at an ordinary temperature under an ordinary pressure. More preferably, examples of the water-soluble resin composition include polyethylene oxide, polypropylene oxide, polyvinyl alcohol, sodium polyacrylate, polyacrylamide, polyvinyl pyrrolidone, carboxymethyl cellulose, polytetramethylene glycol, polyether ester and polyvinyl alcohol. The water-soluble resin composition can be used singly or a mixture of at least two water-soluble resin compositions can be used, as required. Further, it is preferred that a water-soluble lubricant, to be described later, is used in combination with the water-soluble resin composition for the purpose of increasing lubrication effect at a drilling time.

Specific examples of the water-soluble lubricant, which is preferably used in combination with the water-soluble resin composition used in the multi-layered water-soluble resin composition layer of the entry sheet of the present invention, include polyethylene glycol, polypropylene glycol; monoethers of polyoxyethylene such as polyoxyethylene oleyl ether, polyoxyethylene cetyl ether, polyoxyethylene stearyl ether, polyoxyethylene lauryl ether, polyoxyethylene nonylphenyl ether and polyoxyethylene octylphenyl ether; polyoxyethylene monostearate, polyoxyethylene sorbitan monostearate; polyglycerin monostearates such as hexaglycerin monostearate and decahexaglycerin monostearate; and polyoxyethylene propylene copolymer. The water-soluble lubricant can be used singly or at least two water-soluble lubricants can be used in combination, as required. The amount of the water-soluble lubricant per 100 parts by weight of the total of the water-soluble resin composition and the water-soluble lubricant is 10 to 90 parts by weight, more preferably 20 to 80 parts by weight. When the amount of the water-soluble lubricant is less than 10 parts by weight, a problem is apt to be occur in the lubrication effect at a drilling time. When it is larger than 90 parts by weight, the multi-layered water-soluble resin composition layer become fragile. Further, a variety of additives can be used in the water-soluble resin composition. For example, an organic or inorganic filler, a dye or a coloring pigment is used in accordance with an intended purpose.

The metal foil used in the entry sheet for drilling, provided by the present invention, is preferably an aluminum foil having a thickness of 50 to 300 μm. When the thickness of the aluminum foil is less than 50 μm, burrs are apt to be occur in a copper-clad laminate at a drilling time. When it exceeds 300 μm, it is difficult to discharge chips occurring at a drilling time. With regard to the material of the aluminum foil, aluminum having a purity of at least 95% is preferred. Specific examples thereof include 8021, 5052, 3004, 3003, 1N30, 1050, 1070 and 1085, each of which is defined in JIS-H4160. The use of a high-purity aluminum foil as the metal foil alleviates the shock of a drill bit and improves the biting properties of a drill bit. Both the above use of a high-purity aluminum foil and the lubrication effect of the multi-layered water-soluble resin composition layer on a drill bit improve the hole registration accuracy of a drilled hole. It is preferred to use an aluminum foil having an adhesive film having a thickness of 0.1 to 10 μm formed thereon in terms of adhesion to the water-soluble resin composition. Examples of an adhesive used for the adhesive film include urethane adhesives, vinyl acetate adhesives, vinyl chloride adhesives, polyester adhesives, adhesives of copolymers of these compounds, epoxy adhesives and cyanate adhesives.

When a printed wiring board material such as a copper-clad laminate or a multi-layer board is drilled, the entry sheet of the present invention is disposed on at least a top surface of a copper-clad laminate, a multi-layer board or a stack of a plurality of copper-clad laminates or multi-layer boards such that the entry sheet is brought into contact with the printed wiring board material. A hole is drilled from the multi-layered water-soluble resin composition layer side of the entry sheet for drilling. When many air bubbles exist in a water-soluble resin composition layer of an entry sheet for drilling at a drilling time, drilling processability is good in a portion having no air bubble. However, drilling processability is poor in a portion having an air bubble. Therefore, hole registration accuracy deteriorates as a whole. The relation between the size and number of air bubbles and the influence on drilling processability depends on a drill to be used, while excellent hole registration accuracy can be obtained when the number of air bubbles having a diameter of at least 30 μm each is 20 or less in an area of 100 mm×100 mm.

EXAMPLES

The present invention will be concretely explained with reference to Examples and Comparative Examples, hereinafter.

Example 1

50 parts by weight of a polyethylene glycol dimethyl terephthalate polycondensate (Paogen PP-15, supplied by Daiichi-Kogyo Seiyaku Co., Ltd.) and 50 parts by weight of polyethylene glycol having a number average molecular weight of 20,000 (PEG20000, supplied by Sanyo Chemical Industries, Ltd.) were dissolved in hot water in a 1-t stirring furnace to prepare a water-soluble resin composition solution having a solid content concentration of 50%. The water-soluble resin composition solution was applied to one surface of an aluminum foil having a thickness of 100 μm (supplied by Mitsubishi Aluminum Co., Ltd., material 3004) with a die coater (supplied by Yasui Seiki Co., Ltd.) such that the thickness of the applied solution was 80 μm. The applied solution was dried with a dryer at an average temperature of 120° C. and cooled at a line speed of 9 m/min, to obtain a sheet A having a first water-soluble resin composition layer having a thickness of 40 μm (resin composition/aluminum foil=40 μm/100 μm). The same water-soluble resin composition solution was again applied to the surface of the first water-soluble resin composition layer of the above-obtained sheet A with the same die coater such that the thickness of the applied water-soluble resin composition solution was 80 μm so as to be able to obtain a second water-soluble resin composition layer having a thickness of 40 μm after drying and solidification. The applied solution was dried with a dryer at an average temperature of 120° C. at a line speed of 7 m/min to obtain an entry sheet B having a multi-layered water-soluble resin composition layer for drilling (resin composition/aluminum foil=80 μm/100 μm). The multi-layered water-soluble resin composition layer of the entry sheet B was observed from its surface with a metallographical microscope (magnification: 100) and the number of air bubbles having a diameter of at least 30 μm each, which adversely affect hole registration accuracy, was counted. The observation was conducted in a 100 mm×100 mm area of the multi-layered water-soluble resin composition layer surface of the entry sheet B for drilling. Table 1 shows the results. Further, the entry sheet B for drilling was disposed on a stack of four copper-clad laminates having a thickness of 0.2 mm each (CCL-HL832HS, copper foils on both sides 12 μm, supplied by Mitsubishi Gas Chemical Company, Inc.) such that the multi-layered water-soluble resin composition layer side faced upward. A backing plate (bakelite plate) was disposed on the lower side of the stack of the copper-clad laminates. Drilling was carried out under conditions of a drill bit diameter of 0.15 mm, a rotation frequency of 150,000 rpm and a chipload of 12 μm/rev. The number of hits per drill bit was 3,000, and holes were drilled with 20 drill bits. Hole registration accuracy was evaluated. Table 1 shows the results.

Example 2

50 parts by weight of a polyethylene glycol dimethyl terephthalate polycondensate (Paogen PP-15, supplied by Daiichi-Kogyo Seiyaku Co., Ltd.) and 50 parts by weight of polyethylene glycol having a number average molecular weight of 20,000 (PEG20000, supplied by Sanyo Chemical Industries, Ltd.) were dissolved in hot water in a 1-t stirring furnace to prepare a water-soluble resin composition solution having a solid content concentration of 50%. The water-soluble resin composition solution was applied to one surface of an aluminum foil having a thickness of 100 μm (supplied by Mitsubishi Aluminum Co., Ltd., material 3004) with a die coater (supplied by Yasui Seiki Co., Ltd.) such that the thickness of the applied solution was 100 μm. The applied solution was dried with a dryer at an average temperature of 120° C. and cooled at a line speed of 9 m/min, to obtain a sheet C having a first water-soluble resin composition layer having a thickness of 50 μm (resin composition/aluminum foil=50 μm/100 μm). The same water-soluble resin composition solution was again applied to the surface of the first water-soluble resin composition layer of the above-obtained sheet C with the same die coater such that the thickness of the applied solution was 100 μm. The applied solution was dried with a dryer at an average temperature of 120° C. and cooled at a line speed of 5 m/min to form a second water-soluble resin composition layer having a thickness of 50 μm, whereby an entry sheet D having a multi-layered water-soluble resin composition layer for drilling (resin composition/aluminum foil=100 μm/100 μm) was obtained. The multi-layered water-soluble resin composition layer of the entry sheet D was observed from its surface with a metallographical microscope (magnification: 100) and the number of air bubbles having a diameter of at least 30 μm each, which adversely affect hole registration accuracy, was counted. The observation was conducted in a 100 mm×100 mm area of the multi-layered water-soluble resin composition layer surface of the entry sheet D for drilling. Table 1 shows the results. Further, the entry sheet D for drilling was disposed on a stack of four copper-clad laminates having a thickness of 0.2 mm each (CCL-HL832HS, copper foils on both sides 12 μm, supplied by Mitsubishi Gas Chemical Company, Inc.) such that the multi-layered water-soluble resin composition layer side faced upward. A backing plate (bakelite plate) was disposed on the lower side of the stack of the copper-clad laminates. Drilling was carried out under conditions of a drill bit diameter of 0.15 mm, a rotation frequency of 150,000 rpm and a chipload of 12 μm/rev. The number of hits per drill bit was 3,000, and holes were drilled with 20 drill bits. Hole registration accuracy was evaluated. Table 1 shows the results.

Example 3

50 parts by weight of a polyethylene glycol dimethyl terephthalate polycondensate (Paogen PP-15, supplied by Daiichi-Kogyo Seiyaku Co., Ltd.) and 50 parts by weight of polyethylene glycol having a number average molecular weight of 20,000 (PEG20000, supplied by Sanyo Chemical Industries, Ltd.) were dissolved in hot water in a 1-t stirring furnace to prepare a water-soluble resin composition solution having a solid content concentration of 50%. The water-soluble resin composition solution was applied to one surface of an aluminum foil having a thickness of 100 μm (supplied by Mitsubishi Aluminum Co., Ltd., material 3004) with a die coater (supplied by Yasui Seiki Co., Ltd.) such that the thickness of the applied solution was 100 μm. The applied solution was dried with a dryer at an average temperature of 120° C. and cooled at a line speed of 9 m/min, to obtain a sheet E having a first water-soluble resin composition layer having a thickness of 50 μm (resin composition/aluminum foil=50 μm/100 μm). The same water-soluble resin composition solution was again applied to the surface of the first water-soluble resin composition layer of the above-obtained sheet E with the same die coater such that the thickness of the applied solution was 100 μm. The applied solution was dried with a dryer at an average temperature of 120° C. and cooled at a line speed of 5 m/min to form a second water-soluble resin composition layer having a thickness of 50 μm, whereby a sheet F (resin composition/aluminum foil=100 μm/100 μm) was obtained. The same water-soluble resin composition solution was again applied to the surface of the second water-soluble resin composition layer of the above-obtained sheet F with the same die coater such that the thickness of the applied solution was 100 μm. The applied solution was dried with a dryer at an average temperature of 120° C. and cooled at a line speed of 5 m/min to form a third water-soluble resin composition layer having a thickness of 50 μm, whereby an entry sheet G having a multi-layered water-soluble resin composition layer for drilling (resin composition/aluminum foil=150 μm/100 μm) was obtained. The multi-layered water-soluble resin composition layer of the entry sheet G was observed from its surface with a metallographical microscope (magnification: 100) and the number of air bubbles having a diameter of at least 30 μm each, which adversely affect hole registration accuracy, was counted. The observation was conducted in a 100 mm×100 mm area of the multi-layered water-soluble resin composition layer surface of the entry sheet G for drilling. Table 1 shows the results. Further, the entry sheet G for drilling was disposed on a stack of three copper-clad laminates having a thickness of 0.8 mm each (CCL-HL830, copper foils on both sides 12 μm, supplied by Mitsubishi Gas Chemical Company, Inc.) such that the multi-layered water-soluble resin composition layer side faced upward. A backing plate (bakelite plate) was disposed on the lower side of the stack of the copper-clad laminates. Drilling was carried out under conditions of a drill bit diameter of 0.25 mm, a rotation frequency of 120,000 rpm and a chipload of 20 μm/rev. The number of hits per drill bit was 3,000, and holes were drilled with 5 drill bits. The state of inner walls was evaluated. Table 1 shows the results.

Comparative Example 1

50 parts by weight of a polyethylene glycol dimethyl terephthalate polycondensate (Paogen PP-15, supplied by Daiichi-Kogyo Seiyaku Co., Ltd.) and 50 parts by weight of polyethylene glycol having a number average molecular weight of 20,000 (PEG20000, supplied by Sanyo Chemical Industries, Ltd.) were dissolved in hot water in a 1-t stirring furnace to prepare a water-soluble resin composition solution having a solid content concentration of 50%. The water-soluble resin composition solution was applied to one surface of an aluminum foil having a thickness of 100 μm (supplied by Mitsubishi Aluminum Co., Ltd., material 3004) with a die coater (supplied by Yasui Seiki Co., Ltd.) such that the thickness of the applied solution was 160 μm. The applied solution was dried with a dryer at an average temperature of 120° C. and cooled at a line speed of 5 m/min, to obtain an entry sheet H having a water-soluble resin composition layer having a thickness of 80 μm for drilling (resin composition/aluminum foil=80 μm/100 μm). The water-soluble resin composition layer of the entry sheet H was observed from its surface with a metallographical microscope (magnification: 100) and the number of air bubbles having a diameter of at least 30 μm each, which adversely affect hole registration accuracy, was counted. The observation was conducted in a 100 mm×100 mm area of the water-soluble resin composition layer surface of the entry sheet H for drilling. Table 1 shows the results. Further, the entry sheet H for drilling was disposed on a stack of four copper-clad laminates having a thickness of 0.2 mm each (CCL-HL832HS, copper foils on both sides 12 μm, supplied by Mitsubishi Gas Chemical Company, Inc.) such that the water-soluble resin composition layer side faced upward. A backing plate (bakelite plate) was disposed on the lower side of the stack of the copper-clad laminates. Drilling was carried out under conditions of a drill bit diameter of 0.15 mm, a rotation frequency of 150,000 rpm and a chipload of 12 μm/rev. The number of hits per drill bit was 3,000, and holes were drilled with 20 drill bits. Hole registration accuracy was evaluated. Table 1 shows the results.

Comparative Example 2

50 parts by weight of a polyethylene glycol dimethyl terephthalate polycondensate (Paogen PP-15, supplied by Daiichi-Kogyo Seiyaku Co., Ltd.) and 50 parts by weight of polyethylene glycol having a number average molecular weight of 20,000 (PEG20000, supplied by Sanyo Chemical Industries, Ltd.) were dissolved in hot water in a 1-t stirring furnace to prepare a water-soluble resin composition solution having a solid content concentration of 50%. The water-soluble resin composition solution was applied to one surface of an aluminum foil having a thickness of 100 μm (supplied by Mitsubishi Aluminum Co., Ltd., material 3004) with a die coater (supplied by Yasui Seiki Co., Ltd.) such that the thickness of the applied solution was 200 μm. The applied solution was dried with a dryer at an average temperature of 120° C. and cooled at a line speed of 5 m/min, to obtain an entry sheet I having a water-soluble resin composition layer having a thickness of 100 μm for drilling (resin composition/aluminum foil=100 μm/100 μm). The water-soluble resin composition layer of the entry sheet I was observed from its surface with a metallographical microscope (magnification: 100) and the number of air bubbles having a diameter of at least 30 μm each, which adversely affect hole registration accuracy, was counted. The observation was conducted in a 100 mm×100 mm area of the water-soluble resin composition layer surface of the entry sheet I for drilling. Table 1 shows the results. Further, the entry sheet I for drilling was disposed on a stack of four copper-clad laminates having a thickness of 0.2 mm each (CCL-HL832HS, copper foils on both sides 12 μm, supplied by Mitsubishi Gas Chemical Company, Inc.) such that the water-soluble resin composition layer side faced upward. A backing plate (bakelite plate) was disposed on the lower side of the stack of the copper-clad laminates. Drilling was carried out under conditions of a drill bit diameter of 0.15 mm, a rotation frequency of 150,000 rpm and a chipload of 12 μm/rev. The number of hits per drill bit was 3,000, and holes were drilled with 20 drill bits. Hole registration accuracy was evaluated. Table 1 shows the results. Further, the entry sheet I for drilling was disposed on a stack of three copper-clad laminates having a thickness of 0.8 mm each (CCL-HL830, copper foils on both sides 12 μm, supplied by Mitsubishi Gas Chemical Company, Inc.) such that the water-soluble resin composition layer side faced upward. A backing plate (bakelite plate) was disposed on the lower side of the stack of the copper-clad laminates. Drilling was carried out under conditions of a drill bit diameter of 0.25 mm, a rotation frequency of 120,000 rpm and a chipload of 20 μm/rev. The number of hits per drill bit was 3,000, and holes were drilled with 5 drill bits. The state of inner walls was evaluated. Table 1 shows the results.

Comparative Example 3

50 parts by weight of a polyethylene glycol dimethyl terephthalate polycondensate (Paogen PP-15, supplied by Daiichi-Kogyo Seiyaku Co., Ltd.) and 50 parts by weight of polyethylene glycol having a number average molecular weight of 20,000 (PEG20000, supplied by Sanyo Chemical Industries, Ltd.) were dissolved in hot water in a 1-t stirring furnace to prepare a water-soluble resin composition solution having a solid content concentration of 50%. The water-soluble resin composition solution was applied to one surface of an aluminum foil having a thickness of 100 μm (supplied by Mitsubishi Aluminum Co., Ltd., material 3004) with a die coater (supplied by Yasui Seiki Co., Ltd.) such that the thickness of the applied solution was 300 μm. However, the thickness of the applied solution was not homogeneous. For this reason, an entry sheet for drilling having a water-soluble resin composition layer thickness of 150 μm could not be produced by a single application.

TABLE 1

| Item | Example | | | Comparative Example | |
|---|---|---|---|---|---|
| | 1 | 2 | 3 | 1 | 2 |
| Water-soluble resin composition layer thickness (μm) | 80 | 100 | 150 | 80 | 100 |
| Number of air bubbles (number) | 0 | 0 | 0 | 27 | 45 |
| Hole registration accuracy (μm) | | | | | |
| Average of (average + 3σ) | 18.9 | 20.0 | — | 32.8 | 35.0 |
| Average of maximum values | 20 | 21 | — | 42 | 80 |
| Inner wall roughness (μm) | | | | | |
| Average (μm) | — | — | 5.2 | — | 6.1 |
| Average of maximum values (μm) | — | — | 7 | — | 10 |

<Evaluation Methods>

1) The number of air bubbles: A water-soluble resin composition layer of an entry sheet for drilling was observed from its surface with a metallographical microscope (supplied by NIKON) at a magnification of 100 and the number of air bubbles having a diameter of at least 30 μm each in a 100 mm×100 mm area was counted.

2) Hole registration accuracy: The displacements of positions of holes formed by 3,000 hits from target coordinates at the backside of the lowest copper-clad laminate of stacked copper-clad laminates were measured per drill bit with a hole analyzer (supplied by Hitachi Via Mechanics, Ltd.). An average thereof and a standard deviation (σ) were obtained. Thus, "average+3σ" and "maximum value" were calculated. Table 1 shows average values of "average+3σ" and "maximum value" in 20 drilling processings.

3) Inner wall roughness: The top copper-clad laminate of a stack of copper-clad laminates after drilling was vertically cut in a direction passing through the upper and lower central points of a drilled hole, to obtain a vertical cutting plane. The vertical cutting plane was polished. The distance between the maximum resin convex part and the maximum resin concave part was measured at a side surface of hole wall. The measurement was carried out at 10 points of the side surfaces of 2,996th drilled hole to 3,000th drilled hole per a drill. An average value of the 50 points, in total, measured with regard to 5 drills was regarded as an average of inner wall roughness. Further, "average of maximum values" represents an average of the maximum values obtained with regard to 5 drills.

What is claimed is:

1. An entry sheet for drilling a printed wiring board material, comprising a metal foil and a multi-layered water-soluble resin composition layer formed on at least one surface of the metal foil,
wherein:
the thickness of each water-soluble resin composition layer of the multi-layered water-soluble resin composition layer is in the range of 10 μm to 50 μm, the thickness of the multi-layered water-soluble resin composition layer is at least 50 μm and the number of air bubbles having a diameter of at least 30 μm each in the multi-layered water-soluble resin composition layer is 20 or less per an area of 100 mm ×100 mm, and each water-soluble resin composition layer comprises at least one selected from the group consisting of polyethylene oxide, polypropylene oxide, sodium polyacrylate, polyacrylamide, polyvinyl pyrrolidone, carboxymethyl cellulose, polytetramethylene glycol, polyether ester, and polyvinyl alcohol.

2. A process for the production of an entry sheet for drilling a printed wiring board material, which process comprises forming a multi-layered water-soluble resin composition layer on at least one surface of a metal foil, wherein:

an aqueous solution of a water-soluble resin composition comprising at least one selected from the group consisting of polyethylene oxide, polypropylene oxide, sodium polyacrylate, polyacrylamide, polyvinyl pyrrolidone, carboxymethyl cellulose, polytetramethylene glycol, polyether ester, and polyvinyl alcohol is applied to the metal foil, dried and solidified to form one water-soluble resin composition layer, the application, drying and solidification of the aqueous solution of the water-soluble resin composition are repeated at least once to form at least one water-soluble resin composition layer on the above one water-soluble resin composition layer, the multi-layered water-soluble resin composition layer is composed of the one water-soluble resin composition layer and the at least one water-soluble resin composition layer, the thickness of each water-soluble resin composition layer, formed by carrying out the application, drying and solidification of the aqueous solution of the water-soluble resin composition, once, is in the range of 10 μm to 50 μm, and the thickness of the multi-layered water-soluble resin composition layer is at least 50 μm and the number of air bubbles having a diameter of at least 30 μm each in the multi-layered water-soluble resin composition layer is 20 or less per an area of 100 mm ×100 mm.

* * * * *